United States Patent
Oka et al.

(10) Patent No.: US 9,711,661 B2
(45) Date of Patent: Jul. 18, 2017

(54) SEMICONDUCTOR DEVICE AND MANUFACTURING METHOD THEREOF

(71) Applicant: TOYODA GOSEI CO., LTD., Kiyosu-shi (JP)

(72) Inventors: Tohru Oka, Kiyosu (JP); Kazuya Hasegawa, Kiyosu (JP); Nariaki Tanaka, Kiyosu (JP); Noriaki Murakami, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/612,036

(22) Filed: Feb. 2, 2015

(65) Prior Publication Data
US 2015/0295096 A1  Oct. 15, 2015

(30) Foreign Application Priority Data
Apr. 11, 2014  (JP) ................. 2014-082146

(51) Int. Cl.
*H01L 29/872* (2006.01)
*H01L 29/47* (2006.01)
(Continued)

(52) U.S. Cl.
CPC ........ *H01L 29/872* (2013.01); *H01L 21/2855* (2013.01); *H01L 21/28061* (2013.01);
(Continued)

(58) Field of Classification Search
CPC ....... H01L 2224/2745; H01L 21/28061; H01L 21/2855
See application file for complete search history.

(56) References Cited

U.S. PATENT DOCUMENTS 4,987,562 A * 1/1991 Watanabe ......... H01L 23/53223
257/742
9,142,631 B2 9/2015 Mieczkowski et al.
(Continued)

FOREIGN PATENT DOCUMENTS

JP  S46-017130 Y1  6/1971
JP  S61-234074 A   10/1986
(Continued)

OTHER PUBLICATIONS

Notification of Reasons for Refusal in Japanese Office Action dated Feb. 20, 2017, with a JPO website computer-generated English translation thereof.

*Primary Examiner* — Fei Fei Yeung Lopez
(74) *Attorney, Agent, or Firm* — McGinn IP Law Group, PPLC

(57) ABSTRACT

A technique of suppressing leak current in a semiconductor device is provided. A semiconductor device, comprises: a semiconductor layer made of a semiconductor; an insulating layer configured to have electric insulation property and formed to cover part of the semiconductor layer; a first electrode layer formed on the semiconductor layer, configured to have a work function of not less than 0.5 eV relative to electron affinity of the semiconductor layer and extended to surface of the insulating layer to form a field plate structure; and a second electrode layer configured to have electrical conductivity and formed to cover at least part of the first electrode layer. A distance between an edge of a part of the first electrode layer that is in contact with the semiconductor layer and the second electrode layer is equal to or greater than 0.2 μm.

16 Claims, 11 Drawing Sheets

(51) Int. Cl.
    *H01L 29/66*       (2006.01)
    *H01L 21/285*     (2006.01)
    *H01L 21/28*       (2006.01)
    *H01L 29/20*       (2006.01)
    *H01L 29/40*       (2006.01)
    *H01L 29/16*       (2006.01)

(52) U.S. Cl.
    CPC ........ *H01L 21/28581* (2013.01); *H01L 29/47* (2013.01); *H01L 29/475* (2013.01); *H01L 29/66143* (2013.01); *H01L 29/66212* (2013.01); *H01L 29/1608* (2013.01); *H01L 29/2003* (2013.01); *H01L 29/402* (2013.01); *H01L 29/6606* (2013.01); *H01L 2224/2745* (2013.01)

(56) References Cited

U.S. PATENT DOCUMENTS

| | | |
|---|---|---|
| 2002/0027236 A1* | 3/2002 | Uenoyama ............ H01J 1/308 257/256 |
| 2003/0062525 A1* | 4/2003 | Parikh .................. H01L 29/475 257/73 |
| 2004/0053498 A1* | 3/2004 | Kaji .................. H01L 21/76823 438/687 |
| 2005/0110098 A1* | 5/2005 | Yoshihara ....... H01L 21/823437 257/371 |
| 2009/0224788 A1 | 9/2009 | Sasajima et al. |
| 2010/0012168 A1* | 1/2010 | Mihaila ............ H01L 31/0352 136/244 |
| 2010/0059761 A1 | 3/2010 | Horii et al. |
| 2010/0291767 A1* | 11/2010 | Miura .................. C23C 14/165 438/653 |
| 2011/0018005 A1* | 1/2011 | Nakano ................. H01L 21/046 257/77 |
| 2011/0133210 A1 | 6/2011 | Horii et al. |
| 2011/0227089 A1* | 9/2011 | Mieczkowski ... H01L 29/42316 257/76 |
| 2013/0115758 A1* | 5/2013 | Hong ................. H01L 29/6606 438/478 |

FOREIGN PATENT DOCUMENTS

| | | |
|---|---|---|
| JP | S63-311741 A | 12/1988 |
| JP | H04-080962 A | 3/1992 |
| JP | 2002-217132 A | 8/2002 |
| JP | 2008-117979 A | 5/2008 |
| JP | 2008-147388 A | 6/2008 |
| JP | 2008-258504 A | 10/2008 |
| JP | 2009-059912 A | 3/2009 |
| JP | 2009-076866 A | 4/2009 |
| JP | 2009-076874 A | 4/2009 |
| JP | 2009-194255 A | 8/2009 |
| JP | 2010-056100 A | 3/2010 |
| JP | 2010-166012 A | 7/2010 |
| JP | 2010-219130 A | 9/2010 |
| JP | 2011-082392 A | 4/2011 |
| JP | 2011-238866 A | 11/2011 |
| JP | 2013-522906 A | 6/2013 |
| JP | 2014-036215 A | 2/2014 |
| WO | WO 2010/016388 A | 2/2010 |

\* cited by examiner

SEMICONDUCTOR DEVICE AND MANUFACTURING METHOD THEREOF

CROSS-REFERENCE TO RELATED APPLICATION

The present application claims priority from Japanese patent applications No. 2014-082146 filed on Apr. 11, 2014, the entirety of disclosures of which is hereby incorporated by reference into this application.

FIELD OF INVENTION

The invention relates to a semiconductor device.

DESCRIPTION OF RELATED ART

Semiconductor devices (semiconductor elements) functioning as a Schottky barrier diode (SBD) have been known. The Schottky barrier diode may have a filed plate structure employed for the purpose of improving the breakdown voltage (for example, JP 2009-76866A, JP 2009-76874A, JP 2010-56100A and WO 2010/016388A).

SUMMARY OF INVENTION

When the Schottky barrier diode is mounted on a printed circuit board or is used as a circuit component, a thick wiring layer including a metal material having a relatively low resistivity such as Al or Cu is formed on a Schottky electrode to serve as a pad electrode for forming a bonding wire or an electrode for lead wiring. The inventors have, however, found that the breakdown voltage of the semiconductor is lower than a designed value when such a wiring layer is actually made on the Schottky barrier diode having the field plate structure.

FIG. 16 is a diagram illustrating a semiconductor device 900 actually manufactured by a known manufacturing method. As shown in FIG. 16, the semiconductor device 900 includes a semiconductor layer 2, an insulating layer 3 having a side face w inclined with respect to the surface of the semiconductor layer 2, a Schottky electrode 4 stacked on the insulating layer 3 and a wiring layer 5 stacked on the Schottky electrode 4.

As shown in FIG. 16, part p of the Schottky electrode 4 stacked on the side face 2 has a thinner film thickness compared with the film thickness of the other part of the Schottky electrode 4. The material of the wiring layer 5 may be diffused in the Schottky electrode 4 and reach the semiconductor layer 2 through the part p of the Schottky electrode 4 of the thinner film thickness in long time use of the semiconductor device 900 or in use of the semiconductor device 900 under a high temperature environment. When the material employed for the wiring layer 5 has a lower work function than that of the material for the Schottky electrode 4, this may result in a problem of increasing the leak current and lowering the breakdown voltage at the part p of the Schottky electrode 4 of the thinner film thickness.

Accordingly a different method from the above proposed method has been demanded to solve the above problem. Other needs in the semiconductor device include cost reduction, downsizing, easy manufacture, resource saving, improvement of usability and improvement of durability.

In order to solve at least part of the problems described above, the invention may be implemented by aspects described below.

(1) According to one aspect of the invention, there is provided a semiconductor device. The semiconductor device has: a semiconductor layer made of a semiconductor; an insulating layer configured to have electric insulation property and formed to cover part of the semiconductor layer; a first electrode layer formed on the semiconductor layer, configured to have a work function of not less than 0.5 eV relative to electron affinity of the semiconductor layer and extended to surface of the insulating layer to form a field plate structure; and a second electrode layer configured to have electrical conductivity and formed to cover at least part of the first electrode layer, wherein a distance between an edge of a part of the first electrode layer that is in contact with the semiconductor layer and the second electrode layer is equal to or greater than 0.2 µm. The semiconductor device of this aspect suppresses the material of the second electrode layer from reaching the edge of the part where the first electrode layer is in contact with the semiconductor layer. This accordingly suppresses an increase in leak current in long time use or in use under a high temperature environment.

(2) According to one embodiment of the semiconductor device of the above aspect, a distance between the insulating layer and the second electrode layer may be equal to or greater than 0.2 µm. The semiconductor device of this aspect suppresses an increase in leak current.

(3) According to one embodiment of the semiconductor device of any of the above aspects, the first electrode layer of covering a side wall of the insulating layer may have a film thickness that is equal to or greater than a film thickness of the first electrode layer of covering the insulating layer other than the side wall. The semiconductor device of this aspect suppresses an increase in leak current.

(4) According to one embodiment of the semiconductor device of any of the above aspects, the side wall of the insulating layer may have an inclined surface which is inclined with respect to surface of the semiconductor layer. The semiconductor device of this aspect relieves electric field crowding at the edge of the part where the first electrode layer is in contact with the semiconductor layer.

(5) According to one embodiment of the semiconductor device of any of the above aspects, the inclined surface may have an angle of not less than 135 degrees but less than 180 degrees with respect to the surface of the semiconductor layer. The semiconductor device of this aspect further relieves electric field crowding at the edge of the part where the first electrode layer is in contact with the semiconductor layer.

(6) According to one embodiment of the semiconductor device of any of the above aspects, the first electrode layer that is in contact with the semiconductor layer may be made of nickel.

(7) According to one embodiment of the semiconductor device of any of the above aspects, the first electrode layer may have a multi-layered structure.

(8) According to one embodiment of the semiconductor device of any of the above aspects, the second electrode layer may be mainly made of aluminum.

(9) According to one embodiment, the semiconductor device of any of the above aspects may further have a third electrode layer formed between the first electrode layer and the second electrode layer to suppress diffusion of a metal.

(10) According to one embodiment of the semiconductor device of any of the above aspects, the third electrode layer may have a multi-layered structure.

(11) According to one embodiment of the semiconductor device of any of the above aspects, the third electrode layer may include at least one metal or metal compound selected from the group consisting of molybdenum, vanadium, titanium and titanium nitride or its alloy.

(12) According to one embodiment of the semiconductor device of any of the above aspects, the first electrode layer may have a film thickness equal to or greater than 0.1 µm.

(13) According to one embodiment of the semiconductor device of any of the above aspects, the third electrode layer may have a film thickness equal to or greater than 0.1 µm.

(14) According to one embodiment of the semiconductor device of any of the above aspects, the semiconductor layer may be mainly made of gallium nitride.

(15) According to one embodiment of the semiconductor device of any of the above aspects, in projection in a stacking direction, the second electrode layer may be separate from the insulating layer.

(16) According to another aspect of the invention, there is provided a manufacturing method of a semiconductor device. The manufacturing method of the semiconductor device has forming a semiconductor layer; forming an insulating layer of electric insulation property to cover part of the semiconductor layer; forming a first electrode layer on the semiconductor layer, configured to have a work function of not less than 0.5 eV relative to electron affinity of the semiconductor layer and to be extended to surface of the insulating layer to form a field plate structure; and forming a second electrode layer of electrical conductivity to cover at least part of the first electrode layer, wherein a distance between an edge of a part of the first electrode layer that is in contact with the semiconductor layer and the second electrode layer is set equal to or greater than 0.2 µm. The semiconductor device manufactured by the manufacturing method of this aspect suppresses an increase in leak current.

(17) According to one embodiment, the manufacturing method of the semiconductor device of the above aspect, the forming the first electrode layer may form the first electrode layer by a deposition method that obliquely sets a stage where the semiconductor layer is placed with respect to a radial direction of a target and rotates and revolves the stage. The manufacturing method of the semiconductor device of this aspect prevents the film thickness of the first electrode layer formed on the side face of the insulating layer from being thinned and forms the first electrode layer having a uniform film thickness or an increased from thickness at the side face. This suppresses an increase in leak current.

(18) According to one embodiment, the manufacturing method of the semiconductor device of any of the above aspect, the forming the first electrode layer may form the first electrode layer by a sputtering method that applies part of electric power applied to a target as a bias electric power to a stage where the semiconductor layer is placed. The manufacturing method of the semiconductor device of this aspect prevents the film thickness of the first electrode layer formed on the side face of the insulating layer from being thinned and forms the first electrode layer having a uniform film thickness or an increased from thickness at the side face. This suppresses an increase in leak current.

The invention may be implemented by any of various aspects other than the semiconductor device and the manufacturing method; for example, an electrical apparatus including the above semiconductor device and a manufacturing apparatus for manufacturing the above semiconductor device.

The above aspects of the invention suppress the material of the second electrode layer from reaching an edge in a part where the first electrode layer is in contact with the semiconductor layer. This accordingly suppresses an increase in leak current in long time use or in use under a high temperature environment.

DESCRIPTION OF EMBODIMENTS

A. First Embodiment

A-1. Structure of Semiconductor Device

Figure 1:
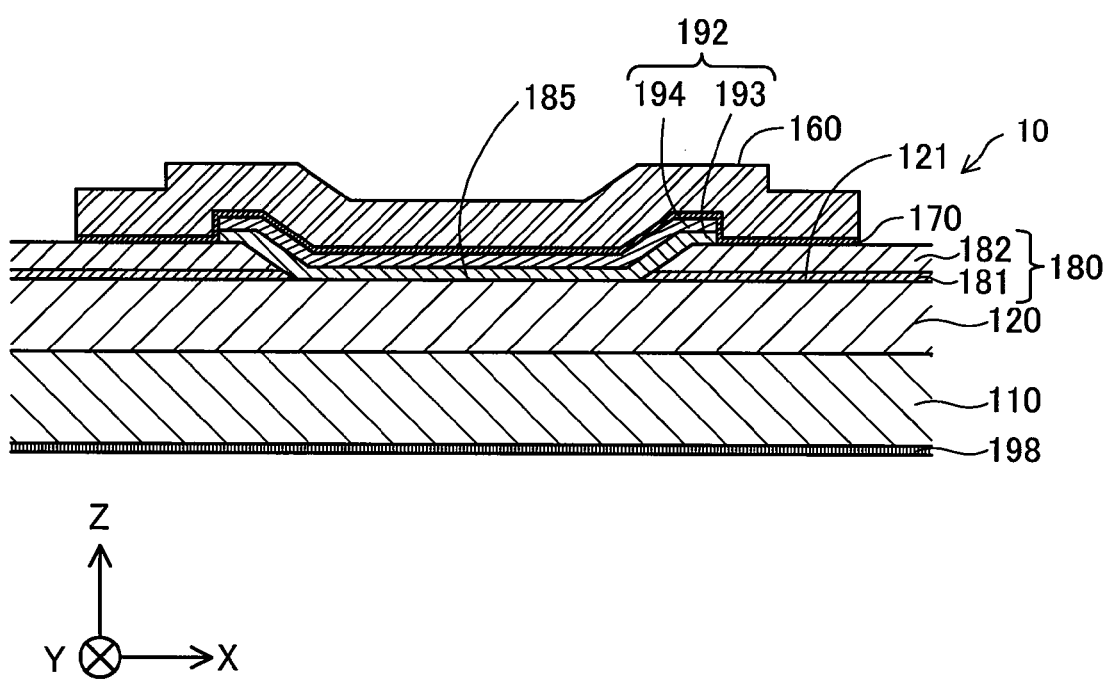
FIG. 1 is a cross sectional view schematically illustrating the structure of a semiconductor device according to a first embodiment.

FIG. 1 is a cross sectional view schematically illustrating the structure of a semiconductor device 10 according to a first embodiment. XYZ axes orthogonal to one another are illustrated in FIG. 1.

Among the XYZ axes in FIG. 1, the X axis is an axis going from the left side of the sheet surface to the right side of the sheet surface of FIG. 1; +X-axis direction is a direction going rightward on the sheet surface and −X-axis direction is a direction going leftward on the sheet surface. Among the XYZ axes in FIG. 1, the Y axis is an axis going from the front side of the sheet surface to the back side of the sheet surface of FIG. 1; +Y-axis direction is a direction going backward on the sheet surface and −Y-axis direction is a direction going forward on the sheet surface. Among the XYZ axes in FIG. 1, the Z axis is an axis going from the lower side of the sheet surface to the upper side of the sheet surface of FIG. 1; +Z-axis direction is a direction going upward on the sheet surface and −Z-axis direction is a direction going downward on the sheet surface.

The semiconductor device 10 is a GaN-based semiconductor device made from gallium nitride (GaN). According to this embodiment, the semiconductor device 10 is a vertical Schottky barrier diode. The semiconductor device 10 includes a substrate 110, a semiconductor layer 120, a wiring layer 160, a barrier metal layer 170, an insulating layer 180, a Schottky electrode 192 and a back side electrode 198. The "Schottky electrode" in Description of Embodiments corresponds to the "first electrode layer" in Summary. Similarly, the "wiring layer" corresponds to the "second electrode layer", and the "barrier metal layer" corresponds to the "third electrode layer".

The substrate 110 of the semiconductor device 10 is a plate-like semiconductor layer extended along the X axis and the Y axis. According to this embodiment, the substrate 110 is an n-type semiconductor layer which is mainly made of gallium nitride (GaN) and contains silicon (Si) as the donor. Being mainly made of gallium nitride (GaN) means containing 90% or more of gallium nitride (GaN) at the mole fraction.

The semiconductor layer 120 of the semiconductor device 10 is an n-type semiconductor layer extended along the X axis and the Y axis. According to this embodiment, the semiconductor layer 120 is mainly made of gallium nitride (GaN) and contains silicon (Si) as the donor. The semiconductor layer 120 is stacked on the +Z-axis direction side of the substrate 110. The semiconductor layer 120 has an interface 121. The interface 121 is a plane which is along the XY plane in which the semiconductor layer 120 is extended and faces the +Z-axis direction. At least part of the interface 121 may be a curved surface or may have irregularity. According to this embodiment, the semiconductor layer 120 has a film thickness of 10 μm and a donor concentration of $1 \times 10^{16}$ cm$^{-3}$.

The insulating layer 180 of the semiconductor device 10 has electrical insulation property and covers the interface 121 of the semiconductor layer 120. The insulating layer 180 includes a first insulating layer 181 and a second insulating layer 182.

The first insulating layer 181 of the insulating layer 180 is a layer which is made of aluminum oxide ($Al_2O_3$) and is adjacent to the interface 121 of the semiconductor layer 120. According to this embodiment, the first insulating layer 181 has a thickness of 100 nm. The second insulating layer 182 of the insulating layer 180 is made of silicon dioxide ($SiO_2$). According to this embodiment, the second insulating layer 182 has a thickness of 500 nm.

The insulating layer 180 has an opening 185 formed to pass through the first insulating layer 181 and the second insulating layer 182. The opening 185 is formed by wet etching.

The Schottky electrode 192 of the semiconductor device 10 is an electrode which has electrical conductivity and is in Schottky contact with the interface 121 of the semiconductor layer 120. According to this embodiment, the Schottky electrode 192 includes a nickel layer 193 made of nickel (Ni) and a palladium layer 194 made of palladium (Pd) sequentially from the semiconductor layer 120-side. In this embodiment, both the nickel layer 193 and the palladium layer 194 have film thicknesses of 100 nm. In the description herein, the Schottky electrode is an electrode having 0.5 eV or more of a difference between electron affinity of the semiconductor layer 120 and work function of the metal used for the Schottky electrode.

According to this embodiment, the Schottky electrode 192 is a conductive layer provided to cover the interface 121 of the semiconductor layer 120 occupying part of the opening 185, a side face of the insulating layer 180 occupying part of the opening 185 and part of a +Z-axis direction side face of the insulating layer 180. The Schottky electrode 192 accordingly forms a field plate structure where the insulating layer 180 is placed between the semiconductor layer 120 and the Schottky electrode 192. The field plate structure is a structure connected with one or a plurality of electrode and arranged from the surface of the semiconductor layer to the surface of the insulating layer provided on the semiconductor layer so as to relieve an electric field at an end of a contact area where the electrode is in contact with the semiconductor layer. In this embodiment, the Schottky electrode is formed in the semiconductor layer and is extended to the surface of the insulating layer, so as to form the field plate structure functioning as the field plate electrode.

The barrier metal layer 170 of the semiconductor device 10 is a layer provided to suppress diffusion of the metal. The barrier metal layer 170 is formed on the Schottky electrode 192.

The barrier metal layer 170 is mainly made of molybdenum (Mo). Being mainly made of molybdenum (Mo) means containing 90% or more of molybdenum (Mo) at the molar fraction. According to this embodiment, the barrier metal layer 170 has a film thickness of 100 nm.

The wiring layer 160 of the semiconductor device 10 is a layer provided on the Schottky electrode to serve as a pad electrode for forming a bonding wire or an electrode for lead wiring, for example, in the application that a Schottky barrier diode is mounted on a printed board or used as a circuit component, and is often made thick to contain a metal material having a relatively low resistivity such as Al, Au or Cu to have the smaller resistance than that of the Schottky electrode layer. The wiring layer 160 of the semiconductor device 10 is formed on the barrier metal layer 170. The wiring layer 160 is a layer for connecting the semiconductor device 10 with the wiring connected with another semiconductor device. The wiring layer 160 is a layer mainly made of aluminum (Al). Being mainly made of aluminum (Al) means containing 90% or more of aluminum (Al) at the molar fraction. According to this embodiment, the wiring layer 160 is made of aluminum silicon (AlSi) which includes 1% of silicon (Si) added to aluminum (Al). In this embodiment, the wiring layer 160 has a film thickness of 4 μm. The wiring layer 160, the barrier metal layer 170 and the Schottky electrode 192 serve as an anode electrode of the Schottky barrier diode.

The back side electrode 198 of the semiconductor device 10 is an electrode which is in ohmic contact with the −Z axis direction side of the substrate 110. According to this embodiment, the back side electrode 198 is an electrode alloyed by heat treatment of a stacked structure of a layer made of aluminum silicon (AlSi) stacked on a layer made of titanium (Ti) (where Ti is located on the substrate side).

A-2. Manufacturing Method of Semiconductor Device

Figure 2:
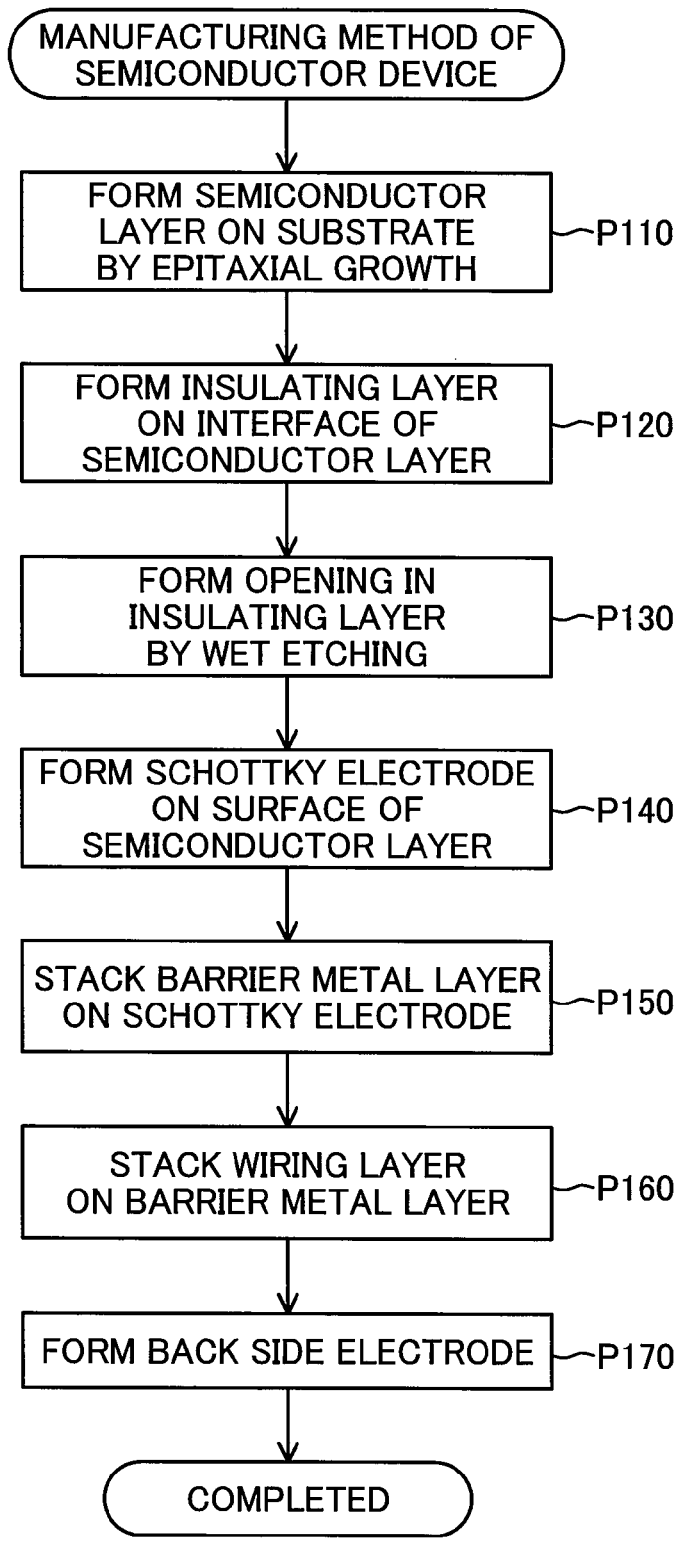
FIG. 2 is a flowchart showing a manufacturing method of the semiconductor device.

FIG. 2 is a flowchart showing a manufacturing method of the semiconductor device 10. In the process of manufacturing the semiconductor device 10, the manufacturer forms the semiconductor layer 120 on the substrate 110 by epitaxial growth at step P110.

Figure 3:
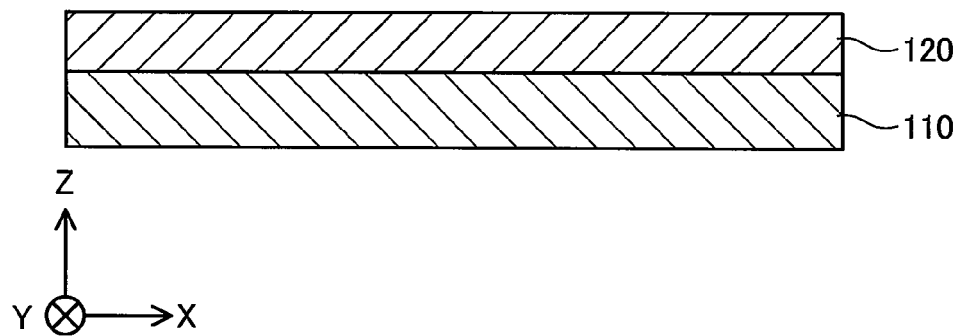
FIG. 3 is a diagram illustrating the structure in which a semiconductor layer is formed on a substrate.

FIG. 3 is a diagram illustrating the structure in which the semiconductor layer 120 is formed on the substrate 110. According to this embodiment, the manufacturer forms the semiconductor layer 120 on the substrate 110 by epitaxial growth using an MOCVD device performing MOCVD (metal organic chemical vapor deposition).

After forming the semiconductor layer 120 (step P110), the manufacturer forms the insulating layer 180 on the interface 121 of the semiconductor layer 120 at step P120.

Figure 4:
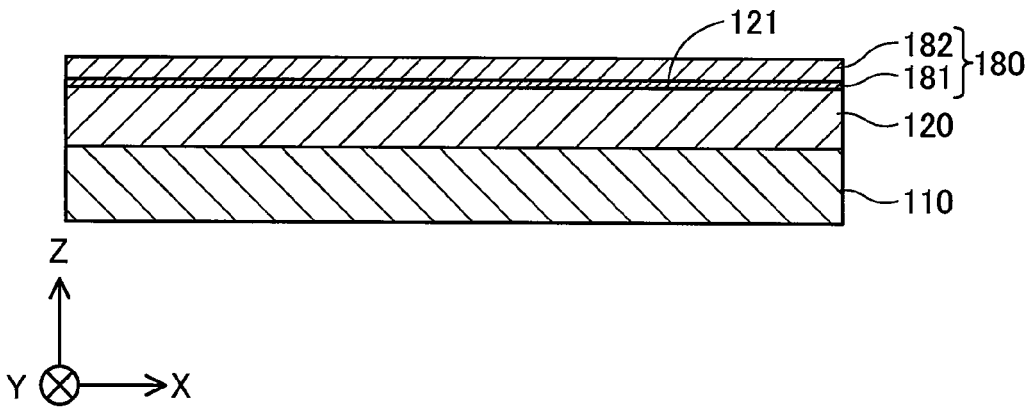
FIG. 4 is a diagram illustrating the structure in which an insulating layer is formed on the semiconductor layer.

FIG. 4 is a diagram illustrating the structure in which the insulating layer 180 is formed on the semiconductor layer 120.

The manufacturer first forms the first insulating layer 181 made of aluminum oxide ($Al_2O_3$) as the insulating layer 180 on the interface 121 of the semiconductor layer 120. According to this embodiment, the manufacturer forms the first insulating layer 181 by ALD (atomic layer deposition) method.

The manufacturer subsequently forms the second insulating layer 182. The second insulating layer 182 is made of silicon dioxide ($SiO_2$). According to this embodiment, the manufacturer forms the second insulating layer 182 by CVD (chemical vapor deposition) method.

After forming the insulating layer 180 (step P120), the manufacturer forms the opening 185 in the insulating layer 180 by wet etching at step P130. According to this embodiment, the manufacturer forms a mask on the insulating layer 180 by photolithography and removes part of the insulating layer 180 by wet etching to form the opening 185.

Figure 5:
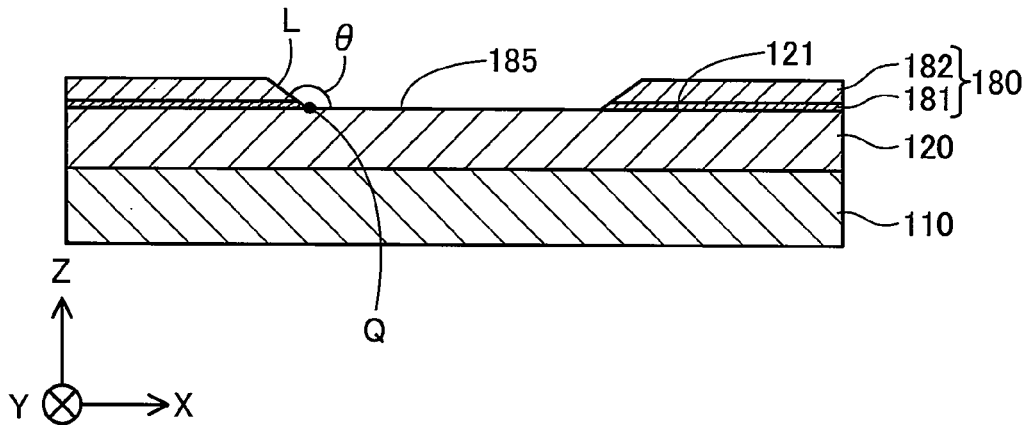
FIG. 5 is a diagram illustrating the structure in which an opening is formed.

FIG. 5 is a diagram illustrating the structure in which the opening 185 is formed. According to this embodiment, a side wall L of the insulating layer 180 which forms a side face of the opening 185 is inclined to have an angle θ (90 degrees<θ<180 degrees) with respect to the semiconductor layer 120. In other words, the side wall L is an inclined surface in this embodiment. An edge Q is a part of the Schottky electrode 192 that is in contact with the insulating layer 180. In terms of sufficiently providing a distance between the edge Q and the wiring layer 160 formed later, the lower limit of the angle θ is preferably not less than 135 degrees and is more preferably not less than 150 degrees. In terms of sufficiently ensuring the breakdown voltage of the insulating layer 180 at the edge Q, on the other hand, the upper limit of the angle θ is preferably less than 180 degrees and is more preferably not greater than 170 degrees. According to this embodiment, the angle θ is equal to 150 degrees. The side wall L of the insulating layer 180 may be perpendicular to the semiconductor layer 120 (θ=90 degrees).

After forming the opening 185 (step P130), the manufacturer first forms the nickel layer 193 and subsequently forms the palladium layer 194 as the Schottky electrode 192 on the interface of the semiconductor layer 120 exposed on the opening 185 of the insulating layer 180 at step P140.

Figure 6:
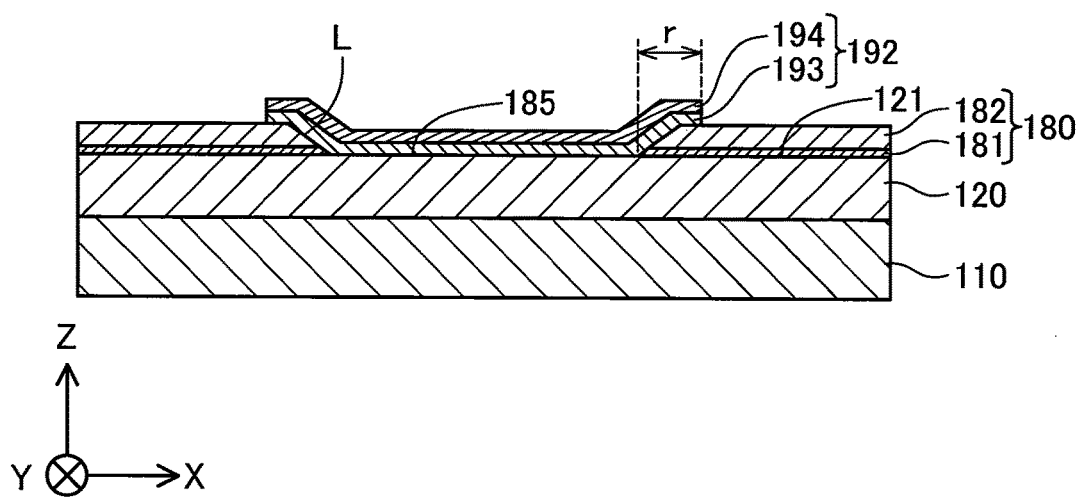
FIG. 6 is a diagram illustrating the structure in which a Schottky electrode is formed.

FIG. 6 is a diagram illustrating the structure in which the Schottky electrode 192 is formed. According to this embodiment, the manufacturer forms the Schottky electrode 192 by lift-off method. More specifically, the manufacturer forms a mask on an area of the insulating layer 180 other than a part where the Schottky electrode 192 is formed by photolithography, causes the nickel layer 193 and the palladium layer 194 to deposit by electron beam (EB) in this sequence on the insulating layer 180 and the opening 185 and subsequently removes the mask from the insulating layer 180 with leaving the Schottky electrode 192. According to this embodiment, the Schottky electrode 192 is formed to cover the interface 121 of the semiconductor layer 120 occupying part of the opening 185, the side wall L of the insulating layer 180 occupying part of the opening 185 and part of the +Z-axis direction side face of the insulating layer 180.

A preferable procedure of deposition for formation of the Schottky electrode 192 obliquely sets a stage where the semiconductor layer 120 is placed with respect to the radial direction of a target and rotates and revolves the stage. This configuration prevents the film thickness of the Schottky electrode 192 from being thinned at the side wall L and forms the Schottky electrode 192 having a uniform film thickness or an increased film thickness at the side face. This suppresses an increase in leak current in long time use or in use under a high temperature environment.

The sputtering method may be employed to form the Schottky electrode 192. When the sputtering method is employed, it is preferable to apply part of electric power applied to a target as a bias electric power to a stage where the semiconductor layer 120 is placed. This causes the film thickness of the Schottky electrode 192 covering the side wall of the insulating layer 180 to be equal to or greater than the film thickness of the Schottky electrode 192 covering the insulating layer 180 other than the side wall. This suppresses an increase in leak current in long time use or in use under a high temperature environment.

Any suitable method other than the lift-off method may be employed to form the Schottky electrode 192. One available method may form the Schottky electrode 192 on the insulating layer 180 and the opening 185, form a mask pattern by a photoresist and remove an unnecessary part by etching or ion milling.

A distance r between an end of the Schottky electrode 192 and an opening end of the opening 185 is shown in FIG. 6. In terms of sufficiently providing the effect of reliving the electric field by the field plate structure and suppressing deterioration of the properties of the semiconductor device 10 as the element caused by diffusion of the subsequently formed barrier metal layer 170 and wiring layer 160 into the semiconductor layer 120, the lower limit of the distance r is preferably not less than 2 μm, is more preferably not less than 5 μm and is furthermore preferably not less than 10 μm. The excessively long distance r, on the other hand, expands the size of the semiconductor device 10 and increases the manufacturing cost. The upper limit of the distance r is thus preferably not greater than 1 mm. In this embodiment, the distance r is set to 10 μm.

Heat treatment is then performed in a nitrogen atmosphere at 400° C. for 30 minutes, in order to stabilize the interface between the Schottky electrode 192 and the insulating layer 180. This heat treatment is not essential but is preferable in terms of stabilizing the interface between the Schottky electrode 192 and the insulating layer 180.

After forming the Schottky electrode 192 (step P140), the manufacture stacks the barrier metal layer 170 on the Schottky electrode 192 by sputtering method at step P150. The barrier metal layer 170 is made of molybdenum (Mo). The material of the barrier metal layer is, however, not limited to molybdenum (Mo) but may be another material such as vanadium (V), titanium (Ti) or titanium nitride (TiN). In other words, the barrier metal layer may contain at least one metal or metal compound selected from the group consisting of molybdenum, vanadium, titanium and titanium nitride or its alloy. The barrier metal layer is not limited to a single layer but may be a multi-layered structure of, for example, titanium nitride (TiN)/titanium (Ti) (where the denominator is the Schottky electrode side: the same applies hereafter in this paragraph), titanium (Ti)/titanium nitride (TiN), molybdenum (Mo)/vanadium (V), vanadium (V)/molybdenum (Mo), or titanium (Ti)/titanium nitride (TiN)/titanium (Ti).

After stacking the barrier metal layer 170 (step P150), the manufacturer further stacks the wiring layer 160 at step P160. The wiring layer 160 is also stacked by the sputtering method. According to this embodiment, the wiring layer 160 is made of aluminum silicon (AlSi). The material of the wiring layer is, however, not limited to aluminum silicon (AlSi) but may be aluminum (Al), aluminum copper (AlCu) or aluminum silicon copper (AlSiCu) mainly made of aluminum (Al) or a material other than aluminum (Al), such as gold (Au) or copper (Cu). The wiring layer is not limited to the single layer but may be a multi-layered structure.

In the embodiment, the wiring layer 160 is formed sequentially after formation of the barrier metal layer 170. More specifically, the layer of molybdenum (Mo) and the layer of aluminum silicon (AlSi) are sequentially formed by the sputtering method.

After stacking the barrier metal layer 170 and the wiring layer 160 by the sputtering method, the method forms a mask pattern by a photoresist. The mask pattern is formed to cover the entire Schottky electrode 192 formed at step P140. The method subsequently removes an area other than a part covered by the photo resist by chlorine-based dry etching to form the barrier metal layer 170 and the wiring layer 160. The technique of deposition by EB (electron beam) may be employed instead of the sputtering method to form the barrier metal layer 170 and the wiring layer 160. Another technique without etching may also be employed: for example, a method of forming a mask pattern by a photoresist and subsequently stacking an electrode material to form the layers by the lift-off method.

Figure 7:
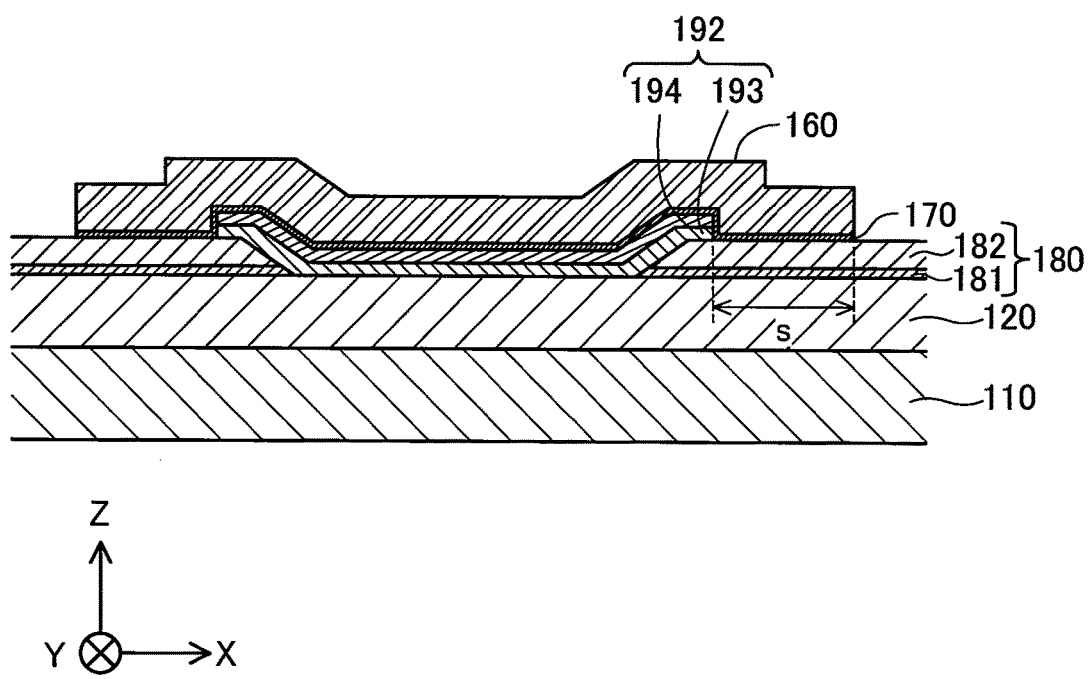
FIG. 7 is a diagram illustrating the structure in which a barrier metal layer and a wiring layer are formed.

FIG. 7 is a diagram illustrating the structure in which the barrier metal layer 170 and the wiring layer 160 are formed. A distance s between an end of the Schottky electrode 192 and an end of the wiring layer 160 is shown in FIG. 7. In terms of sufficiently suppressing peel-off of the Schottky electrode 192 from the insulating layer 180, the lower limit of the distance s is preferably not less than 3 μm, is more preferably not less than 5 μm and is furthermore preferably not less than 10 μm. The excessively long distance s, on the other hand, expands the size of the semiconductor device 10 and increases the manufacturing cost. The upper limit of the distance s is thus preferably not greater than 1 mm. In this embodiment, the distance s is set to 10 μm.

After forming the wiring layer 160 (step P160), the manufacturer forms the back side electrode 198 on the −Z axis direction side of the substrate 110 at step P170. According to this embodiment, the manufacturer forms a layer made of titanium (Ti) by deposition on the −Z axis direction side of the substrate 110, subsequently forms a layer made of aluminum silicon (AlSi) by deposition on the titanium layer and alloys these layers by heat treatment, so as to form the back side electrode 198. The heat treatment reduces the contact resistance of the back side electrode 198. According to this embodiment, the heat treatment is performed in a nitrogen atmosphere at 400° C. for 30 minutes. The sputtering method may be employed for formation of the back side electrode.

The semiconductor device 10 is completed through this sequence of steps.

Figure 8:
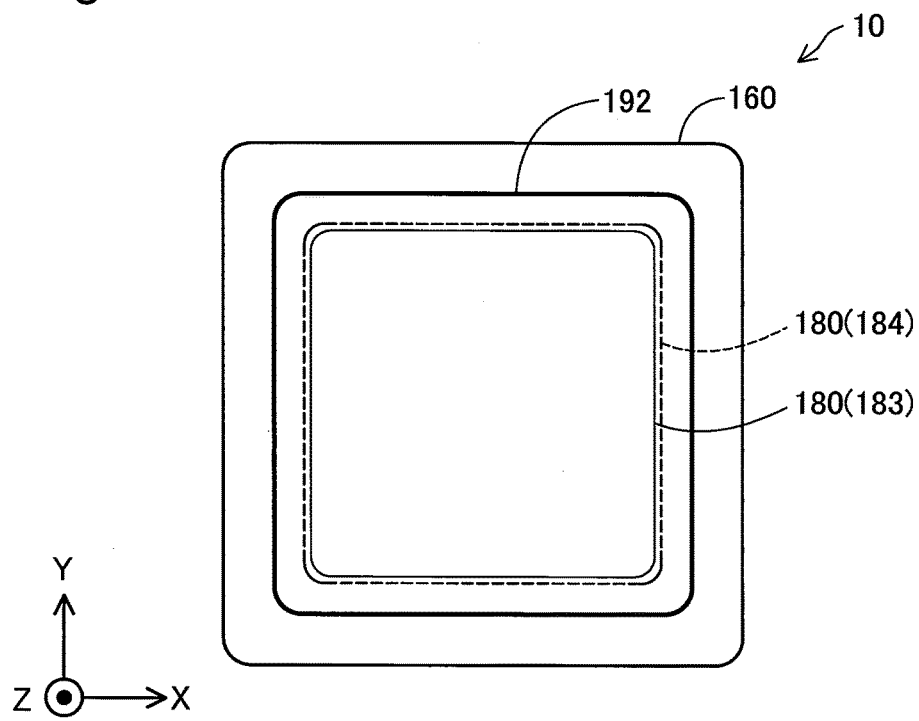
FIG. 8 is a diagram illustrating the semiconductor device of the first embodiment, viewed in a +Z-axis direction.

FIG. 8 is a diagram illustrating the semiconductor device 10, viewed in the +Z-axis direction. The insulating layer 180 has an inclined surface which is inclined with respect to the semiconductor layer 120 (see FIG. 7) and has an edge 183 which is an end of the insulating layer 180 on the semiconductor layer 120-side and an edge 184 which is an end of the insulating layer 180 on the wiring layer 160-side. In the semiconductor device 10, the Schottky electrode 192 covers at least part of the insulating layer 180, and the wiring layer 160 covers the Schottky electrode 192.

Figure 9:
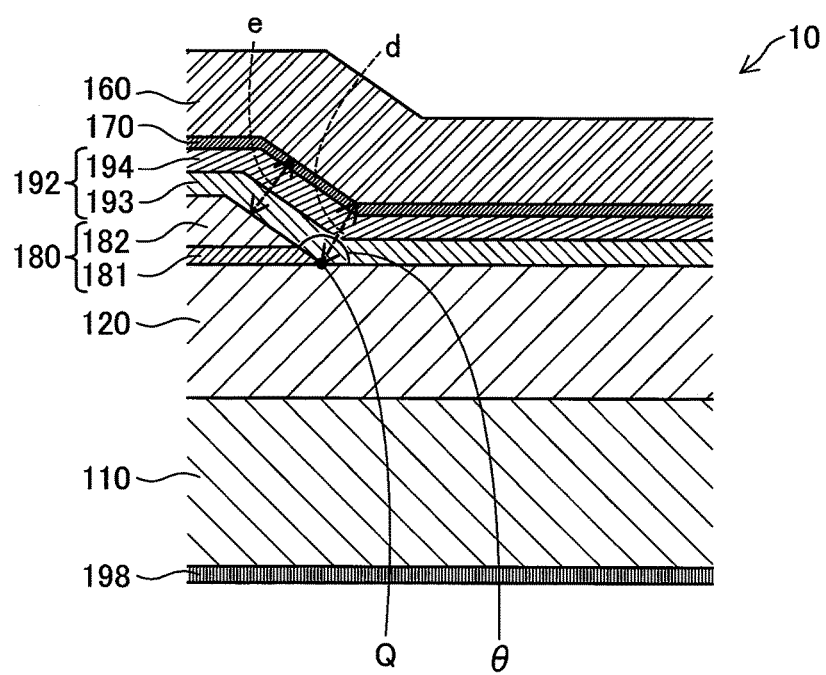
FIG. 9 is an enlarged view illustrating the semiconductor device.

FIG. 9 is an enlarged view illustrating the semiconductor device 10. In this embodiment, the nickel layer 193, the palladium layer 194 and the barrier metal layer 170 respectively have film thicknesses of 100 nm. Accordingly, a distance d between the edge Q and the wiring layer 160 is equal to or greater than 0.2 μm. In this embodiment, the distance d is set to 0.3 μm.

According to the embodiment, a distance e between the insulating layer 180 and the wiring layer 160 is equal to or greater than 0.2 μm. In this embodiment, the distance e is set to 0.3 μm.

A-3. Evaluation of Current-Voltage Characteristic

Figure 10:
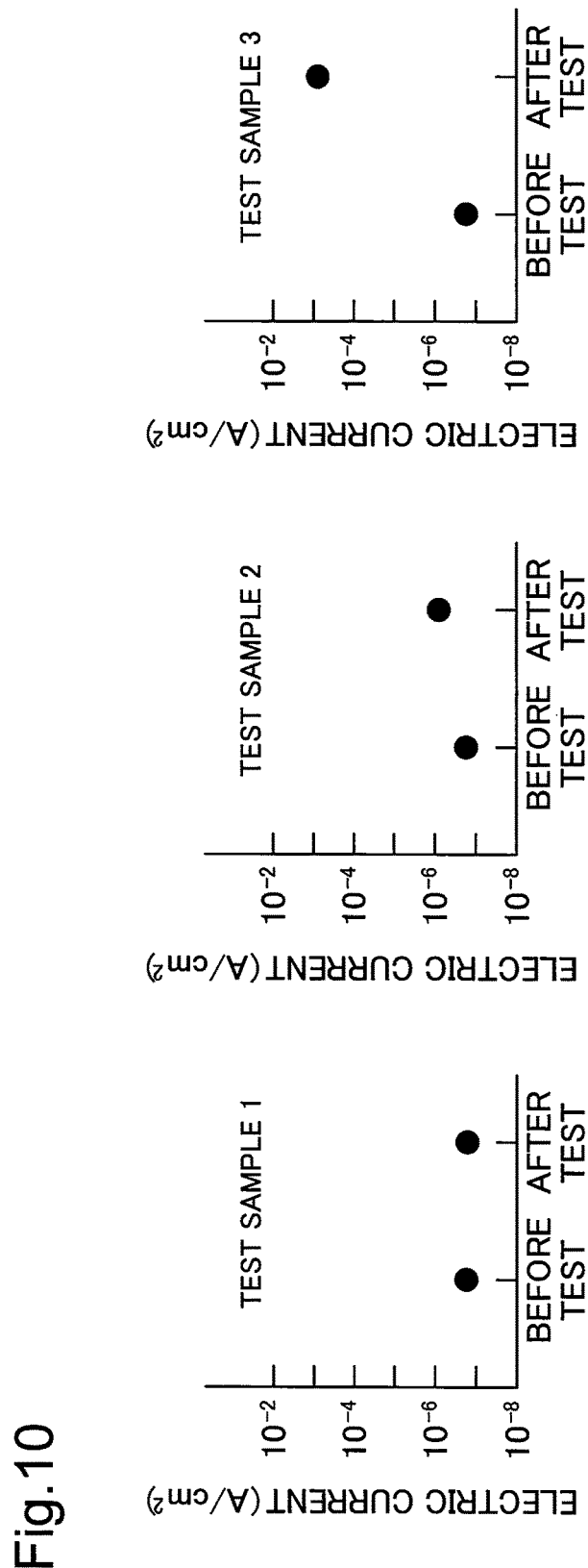
FIG. 10 is graphs showing evaluation results of leak current by the current-voltage characteristic under application of a reverse-direction bias.

FIG. 10 is graphs showing evaluation results of leak current by the current-voltage characteristic under application of a reverse-direction bias. The current-voltage characteristic under application of a reverse-direction bias denotes the current-voltage characteristic under application of a negative voltage to the anode side of the semiconductor device, i.e., to the wiring layer 160. The ordinate shows the value of leak current ($A/cm^2$) in the reverse direction under application of a voltage of −200 V. In the evaluation test of FIG. 10, a plurality of test samples was provided as semiconductor devices. The current-voltage characteristics of these test samples before and after a test which kept the semiconductor layer in a nitrogen atmosphere for 400° C. for 30 minutes were measured for comparison.

Test sample 1 corresponds to the semiconductor device 10 of the first embodiment. The Schottky electrode 192 includes a nickel layer 193 (film thickness: 100 nm), a palladium layer 194 (film thickness: 100 nm) and a barrier metal layer 170 (film thickness: 100 nm) sequentially from the semiconductor layer 120-side. The distance from the edge Q (FIG. 9) to the wiring layer 160 in Test sample 1 is 0.3 μm.

Test sample 2 has a Schottky electrode consisting of only a nickel layer (film thickness: 100 nm). The structure other than the Schottky electrode is similar to the structure of the semiconductor device 10. The distance from the edge Q to the wiring layer 160 in Test sample 2 is 0.2 μm.

Test sample 3 has a Schottky electrode consisting of only a nickel layer (film thickness: 50 nm). The structure other than the Schottky electrode is similar to the structure of the semiconductor device 10. The distance from the edge Q to the wiring layer 160 in Test sample 3 is 0.15 μm.

The graphs of FIG. 10 show the evaluation results of the current-voltage characteristic before and after the test with respect to Test samples 1, 2 and 3 sequentially from the left. In each of the graphs of FIG. 10, the left side shows the evaluation result before the test and the right side shows the evaluation result after the test.

According to the evaluation results of FIG. 10, the current value of Test sample 1 had no substantial change before and after the test; the current value of Test sample 2 increased to about 5-fold after the test; and the current value of Test sample 3 significantly increased to about $10^4$-fold after the test. The breakdown voltage of Test sample 2 was equivalent to that of Test sample 1 and had no significant reduction. Reduction of the breakdown voltage was, however, simultaneously observed in Test sample 3. The current-voltage characteristics were also measured with respect to the same test samples under application of a forward-direction bias (application of a positive voltage on the anode side). The current value, however, had no significant change before and after the test.

Since there is no significant difference in current-voltage characteristic under application of a forward-direction bias, the difference in leak current may be attributed to the characteristic phenomenon under application of a reverse-direction bias, i.e., electric field crowding occurring in the vicinity of the edge Q. While Test sample 3 has a significant increase in leak current after the test, Test sample 1 according to the embodiment of the invention has no substantial change in leak current and Test sample 2 has a significant suppression of the increase in leak current. In other words, these evaluation results show that setting the distance from the edge Q to the wiring layer 160 equal to or greater than 0.2 µm suppresses the material of the wiring layer 160 from reaching the semiconductor layer 120 and suppressing an increase in leak current at the edge of the part where the Schottky electrode is in contact with the semiconductor layer in the semiconductor device.

B. Second Embodiment

Figure 11:
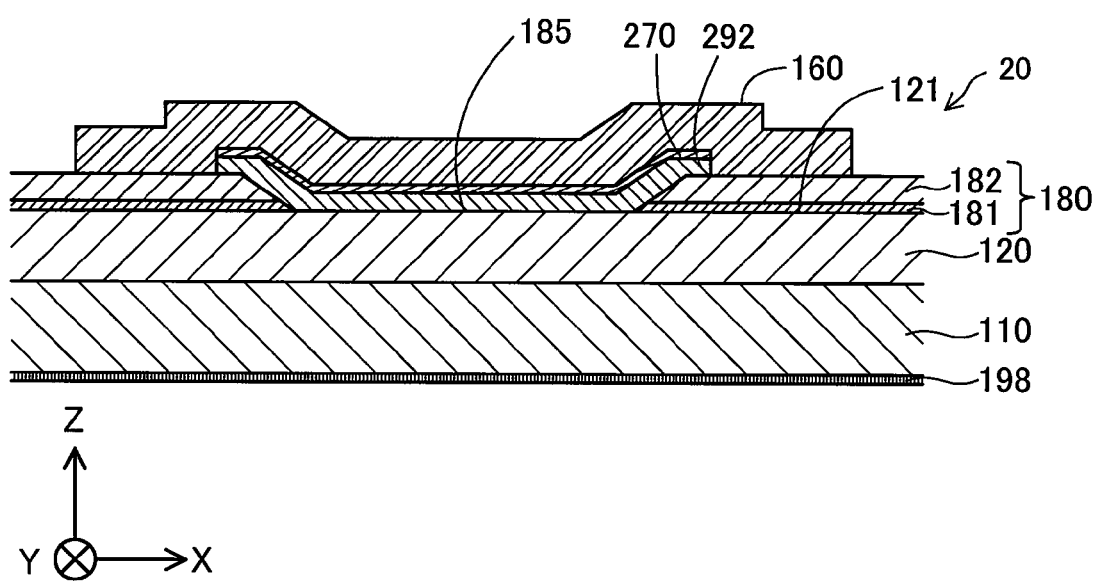
FIG. 11 is a cross sectional view schematically illustrating the structure of a semiconductor device according to a second embodiment.

FIG. 11 is a cross sectional view schematically illustrating the structure of a semiconductor device 20 according to a second embodiment. The semiconductor device 20 of the second embodiment differs from the semiconductor device 10 of the first embodiment by a Schottky electrode, a barrier metal layer and a wiring layer but otherwise has the similar structure to that of the semiconductor device 10 of the first embodiment.

According to this embodiment, a Schottky electrode 292 is made of nickel and has a film thickness of 100 nm. A barrier metal layer 270 is formed on the schottky electrode 292, is made of molybdenum and has a film thickness of 100 nm.

According to this embodiment, a wiring layer 260 is made of an aluminum silicon copper (AlSiCu) prepared by adding 0.5% of silicon (Si) and 0.5% of copper (Cu) to aluminum (Al) and has a film thickness of 4 µm. The invention may also be applicable to the semiconductor device of this structure.

C. Third Embodiment

Figure 12:
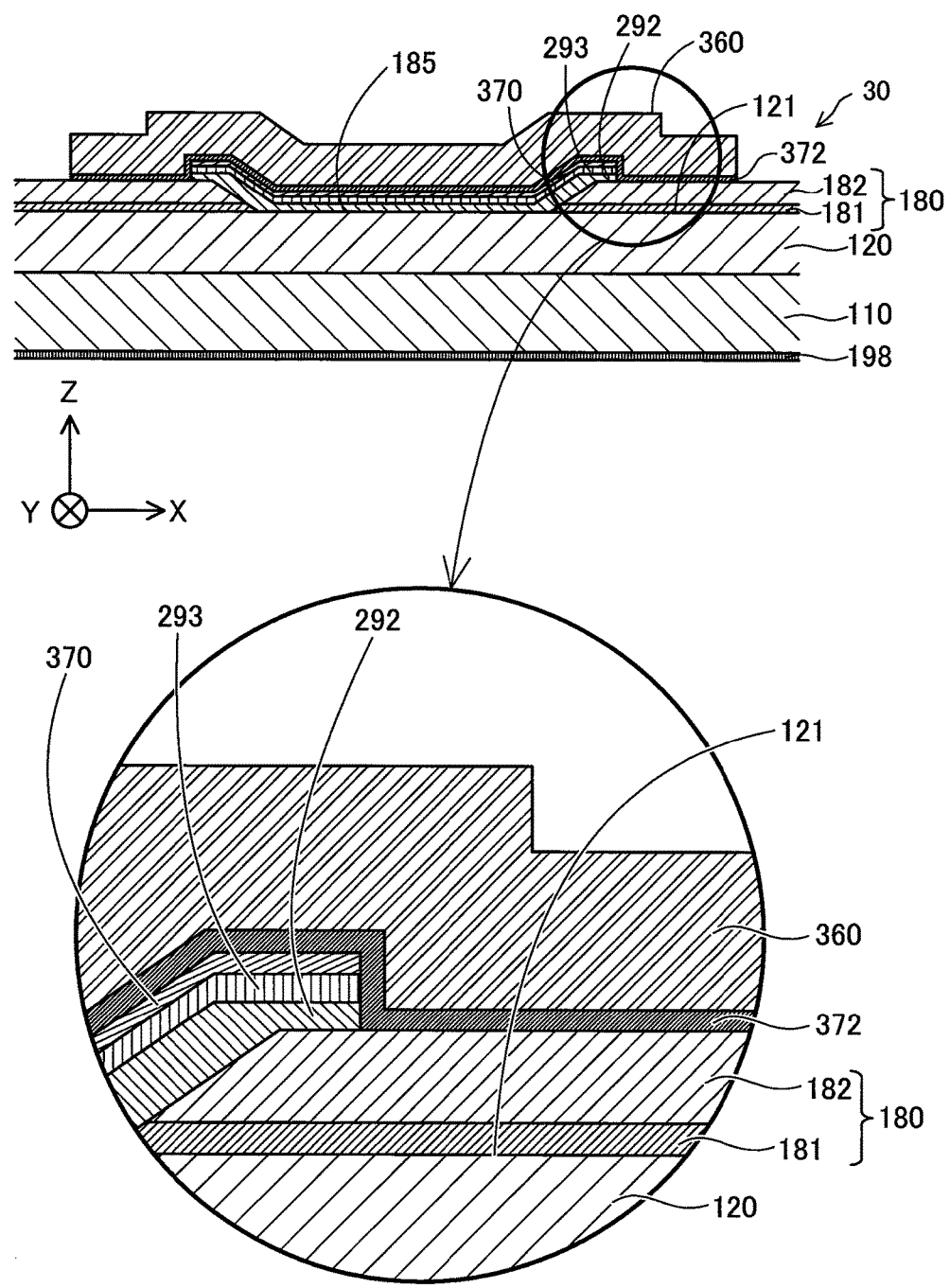
FIG. 12 is a cross sectional view schematically illustrating the structure of a semiconductor device according to a third embodiment.

FIG. 12 is a cross sectional view schematically illustrating the structure of a semiconductor device 30 according to a third embodiment. The semiconductor device 30 of the third embodiment differs from the semiconductor device 20 of the second embodiment by a barrier metal layer, a Schottky electrode and a wiring layer but otherwise has the similar structure to that of the semiconductor device 20 of the second embodiment. In the semiconductor device 30, a Schottky electrode 293 and a barrier metal layer 370 are provided only on a Schottky electrode 292, and a wiring layer 360 includes a barrier metal layer 372 on the semiconductor layer 120-side.

According to this embodiment, the wiring layer 360 is made of aluminum silicon (AlSi) prepared by adding 1% of silicon (Si) to aluminum (Al) and has a film thickness of 4 µm. The barrier metal layer 372 is made of titanium nitride (TiN) and has a film thickness of 200 nm.

The barrier metal layer 370 is made of molybdenum (Mo) and has a film thickness of 10 nm. The schottky electrode 293 is made of palladium (Pd) and has a film thickness of 100 nm. The invention may also be applicable to the semiconductor device of this structure. The film thickness of the molybdenum (Mo) layer of greater than 10 nm, for example, 20 nm, provides the similar result.

D. Fourth Embodiment

Figure 13:
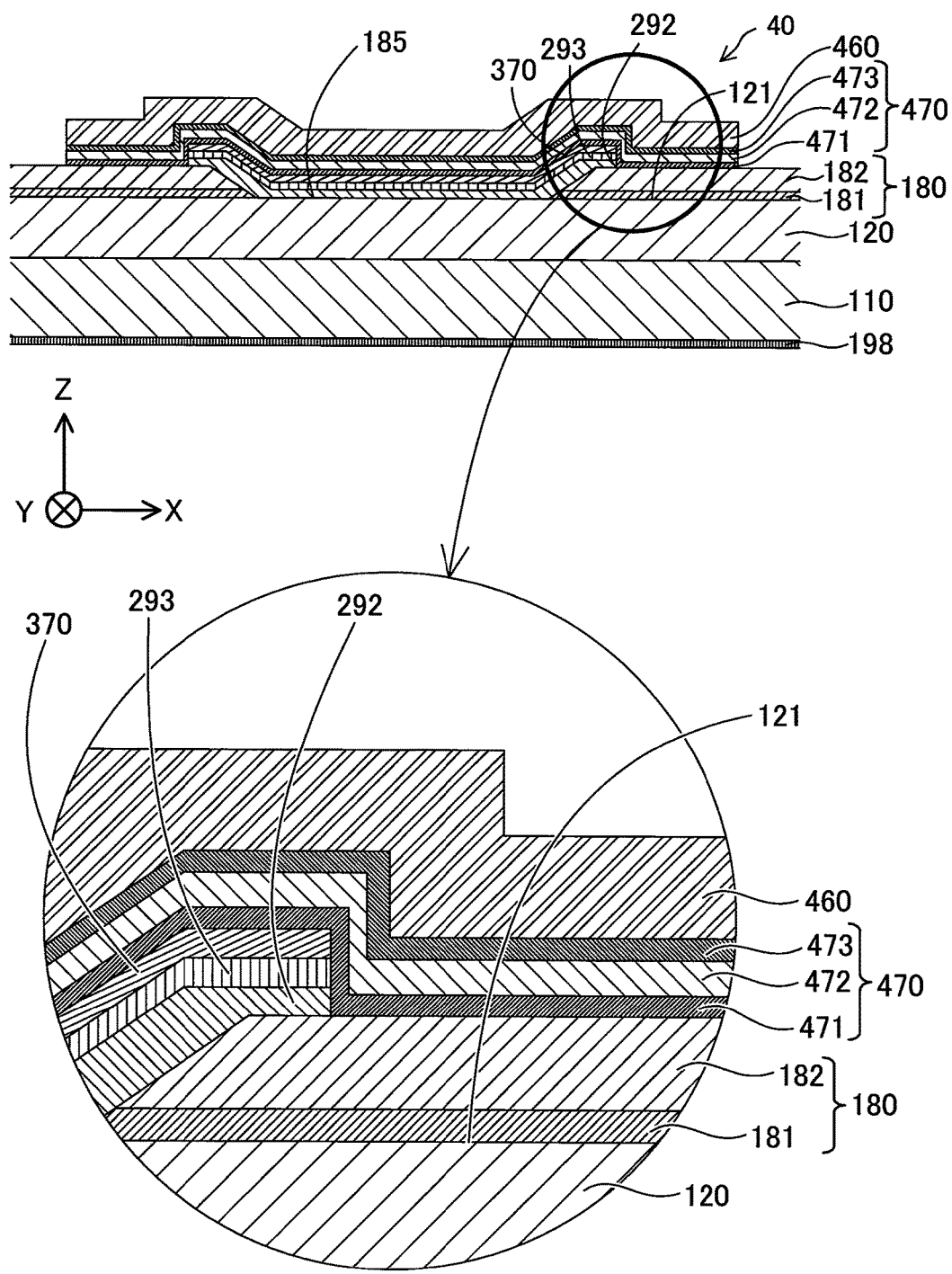
FIG. 13 is a cross sectional view schematically illustrating the structure of a semiconductor device according to a fourth embodiment.

FIG. 13 is a cross sectional view schematically illustrating the structure of a semiconductor device 40 according to a fourth embodiment. The semiconductor device 40 of the fourth embodiment differs from the semiconductor device 30 of the third embodiment by a barrier metal layer and a wiring layer but otherwise has the similar structure to that of the semiconductor device 30 of the third embodiment.

Barrier metal layers are formed on a Schottky electrode 293 and include not only a barrier metal layer 370 but a barrier metal layer 470 stacked below a wiring layer 460.

According to this embodiment, the barrier metal layer 470 includes a titanium layer 471 (thickness: 10 nm) made of titanium (Ti), a titanium nitride layer 472 (thickness: 200 nm) made of titanium nitride (TiN) and a titanium layer 473 (thickness: 10 nm) made of titanium (Ti), which are stacked sequentially from the barrier metal layer 370-side. An aluminum silicon layer (thickness: 4 µm) made of aluminum silicon (AlSi) is stacked as the wiring layer 460 on the barrier metal layer 470. The invention may also be applicable to the semiconductor device of this structure. The film thicknesses of the titanium layer 471 of 5 nm and 20 nm provide the similar results.

E. Fifth Embodiment

Figure 14:
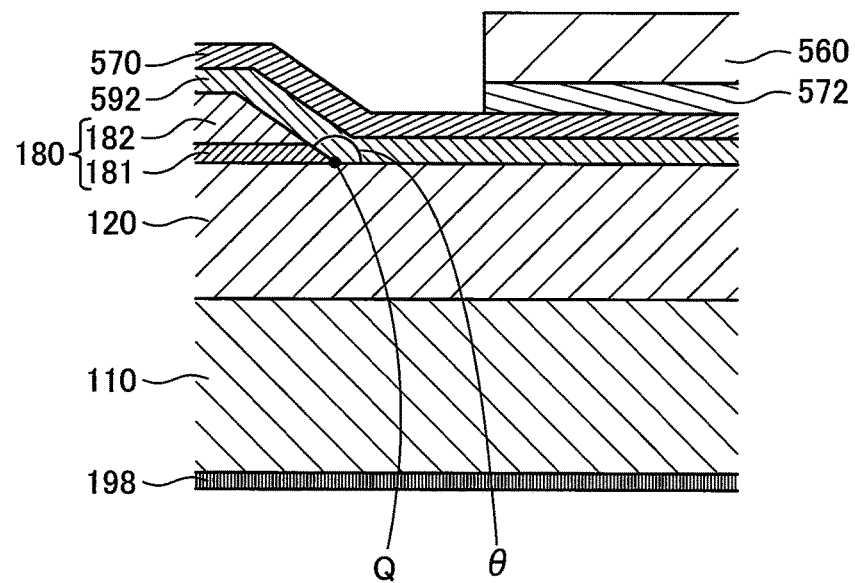
FIG. 14 is a cross sectional view schematically illustrating the structure of a semiconductor device according to a fifth embodiment.

FIG. 14 is a cross sectional view schematically illustrating the structure of a semiconductor device 50 according to a fifth embodiment. The semiconductor device 50 of the fifth embodiment differs from the semiconductor device 10 of the first embodiment by a Schottky electrode, a barrier metal layer and a wiring layer but otherwise has the similar structure to that of the semiconductor device 10 of the first embodiment.

According to this embodiment, a nickel layer (film thickness: 100 nm) made of nickel (Ni) is formed as a Schottky electrode 592, and a molybdenum layer (film thickness: 100 nm) made of molybdenum (Mo) is formed as a barrier metal layer 570 on the nickel layer.

According to this embodiment, a titanium nitride layer (film thickness: 200 nm) made of titanium nitride (TiN) is formed as a barrier metal layer 572 on the molybdenum layer. An aluminum silicon layer (film thickness: 4 µm) made of aluminum silicon (AlSi) is formed as a wiring layer 560 on the titanium nitride layer.

According to this embodiment, the barrier metal layer 572 and the wiring layer 560 are formed on the inner side of the edge Q. More specifically, the wiring layer 560 is formed such that the distance between the edge Q and the wiring layer 560 is equal to or greater than 0.2 µm. This suppresses the material of the wiring layer 560 from reaching the semiconductor layer 120. This embodiment does not need to strictly control the angle θ and broadens the options for selecting the method of forming the Schottky electrode.

Figure 15:
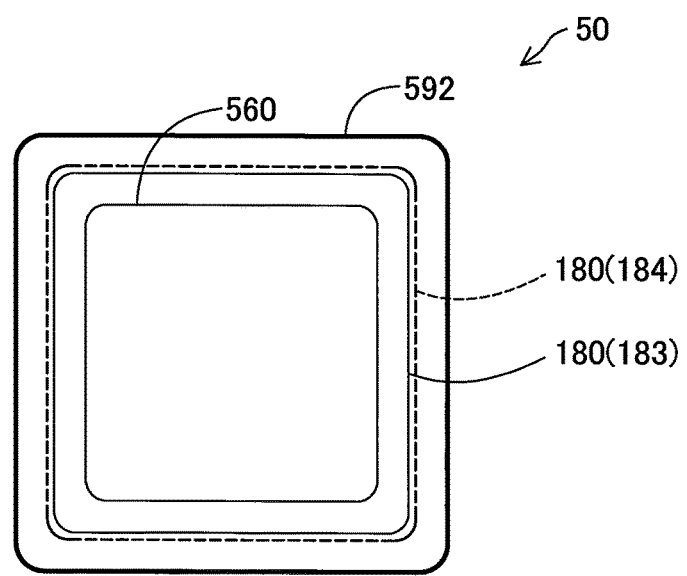
FIG. 15 is a diagram illustrating the semiconductor device of the fifth embodiment, viewed in the +Z-axis direction.
Figure 16:
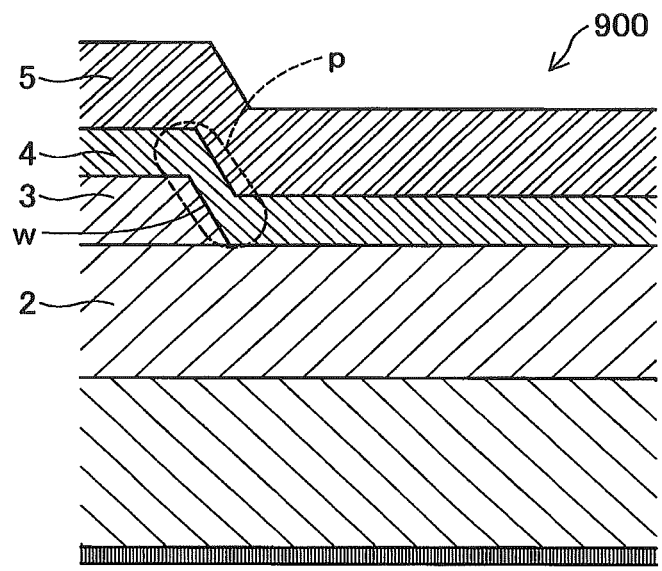
FIG. 16 is a diagram illustrating a semiconductor device actually manufactured by a known manufacturing method.

FIG. 15 is a diagram illustrating the semiconductor device 50 viewed in the +Z-axis direction. The insulating layer 180 has an inclined surface which is inclined with respect to the semiconductor layer 120 (see FIG. 14) and has edges 183 and 184 similar to those of the semiconductor device 10 of the first embodiment. The wiring layer 560 is, however, arranged to cover only part of the Schottky electrode 592 and to be located on the inner side of the edge 183. In other words, in projection in the stacking direction, the wiring layer 560 is separate from the insulating layer 180.

F. Other Embodiments

The invention is not limited to any of the embodiments, the examples and the modifications described herein but may be implemented by a diversity of other configurations without departing from the scope of the invention. For example, the technical features of the embodiments, examples or modifications corresponding to the technical features of the respective aspects described in Summary may be replaced or combined appropriately, in order to solve part or all of the problems described above or in order to achieve part or all of the advantageous effects described above. Any of the technical features may be omitted appropriately unless the technical feature is described as essential herein.

In the above embodiments, the technique of forming the respective layers of the insulating layer is not limited to the ALD method or the CVD method but may be the sputtering method or the application method.

The methods of forming the Schottky electrode, the barrier metal layer and the wiring layer described in the above embodiments include the method of forming the Schottky electrode and then sequentially forming the barrier metal layer and the wiring layer and the method of sequentially forming the Schottky electrode and the barrier metal layer and subsequently forming the wiring layer or subsequently forming another barrier metal layer and the wiring layer. These methods are, however, not essential. For example, another applicable method may individually form a Schottky electrode, a barrier metal layer and a wiring layer.

The semiconductor device includes the barrier metal layer in the above embodiment, but may not include the barrier metal layer. The wiring layer may be a single layer of aluminum (Al) or gold (Au) or may be a multi-layered structure including the barrier metal layer.

The combinations of the insulating layer, the wiring layer, the barrier metal layer and the Schottky electrode described in the above embodiments are preferable combinations in terms of suppressing an increase in leak current and improving the adhesiveness of the respective layers. Other combinations are, however, also available.

In the above embodiment, the insulating layer has the multi-layered structure of silicon oxide ($SiO_2$)/aluminum oxide ($Al_2O_3$). The insulating layer is, however, not limited to this structure but may be a single layer or any suitable multi-layered structure other than the above. The insulating layer may be made of, for example, silicon oxide ($SiO_2$), silicon nitride (SiN), aluminum oxide ($Al_2O_3$), aluminum oxynitride (AlON), zirconium oxide ($ZrO_2$), zirconium oxynitride (ZrON), silicon oxynitride (SiON) or hafnium oxide ($HfO_2$).

In the above embodiment, the material of the substrate is not limited to gallium nitride (GaN) but may be, for example, silicon (Si), sapphire ($Al_2O_3$) or silicon carbide (SiC).

In the above embodiment, the donor included in the n-type semiconductor layer is not limited to silicon (Si) but may be another element such as germanium (Ge) or oxygen (O).

The material of the Schottky electrode is palladium (Pd)/nickel (Ni) (where nickel is on the semiconductor layer side) or nickel (Ni) in the above embodiments. The Schottky electrode is, however, not limited to these embodiments but may have another multi-layered structure or a single layer. The Schottky electrode may be a single layer of, for example, palladium (Pd), platinum (Pt) or gold (Au) or may be a multi-layered structure of, for example, platinum (Pt)/nickel (Ni) or molybdenum (Mo)/palladium (Pd)/nickel (Ni) (where nickel is on the semiconductor layer side).

In the above embodiments, the Schottky barrier diode is used as the semiconductor device. The invention is, however, not limited to these embodiments but is also applicable to a semiconductor device configured to have a field plate structure by using a Schottky electrode, for example, MESFET (Metal Semiconductor Field Effect Transistor) or HFET (hetero FET).

In the above embodiment, the material of the back side electrode is not limited to the alloy of titanium (Ti) and aluminum silicon (AlSi) but may be another metal such as aluminum (Al), vanadium (V) or hafnium (Hf).

The invention claimed is:

1. A semiconductor device, comprising:
   a semiconductor layer made of a semiconductor;
   an insulating layer configured to have electric insulation property and formed to cover part of the semiconductor layer;
   a first electrode layer formed on the semiconductor layer, the first electrode being configured to have a work function of not less than 0.5 eV relative to electron affinity of the semiconductor layer and extended to a surface of the insulating layer to form a field plate structure;
   a second electrode layer configured to have electrical conductivity and formed to cover at least a part of the first electrode layer; and
   a third electrode layer formed between the first electrode layer and the second electrode layer to suppress diffusion of a metal, wherein
   a distance between an edge of the part of the first electrode layer that is in contact with the semiconductor layer and the insulating layer, and the second electrode layer is equal to or greater than 0.2 µm to thereby suppress a material of the second electrode layer from contacting the edge of the part of the first electrode layer that contacts the semiconductor layer, and
   wherein the second electrode layer is mainly made of aluminum wherein the first electrode layer covering a side wall of the insulating layer has a film thickness that is greater than a film thickness of the first electrode layer covering the insulating layer other than the side wall.

2. The semiconductor device according to claim 1, wherein a distance between the insulating layer and the second electrode layer is equal to or greater than 0.2 µm.

3. The semiconductor device according to claim 1, wherein the side wall of the insulating layer has an inclined surface which is inclined with respect to surface of the semiconductor layer.

4. The semiconductor device according to claim 3, wherein the inclined surface has an angle of not less than 135 degrees but less than 180 degrees with respect to the surface of the semiconductor layer.

5. The semiconductor device according to claim 1, wherein the first electrode layer that is in contact with the semiconductor layer is made of nickel.

6. The semiconductor device according to claim 1, wherein the first electrode layer has a multi-layered structure.

7. The semiconductor device according to claim 1, wherein the third electrode layer has a multi-layered structure.

8. The semiconductor device according to claim 1, wherein the third electrode layer includes at least one metal or metal compound selected from the group consisting of molybdenum, vanadium, titanium and titanium nitride or its alloy.

9. The semiconductor device according to claim 1, wherein the first electrode layer has a film thickness equal to or greater than 0.1 µm.

10. The semiconductor device according to claim 1, wherein the third electrode layer has a film thickness equal to or greater than 0.1 µm.

11. The semiconductor device according to claim 1, wherein the semiconductor layer is mainly made of gallium nitride.

12. The semiconductor device according to claim 1, wherein in projection in a stacking direction, the second electrode layer is separate from the insulating layer.

13. The semiconductor device according to claim 1, wherein the first electrode comprises a Schottky electrode.

14. A semiconductor device, comprising:
a semiconductor layer made of a semiconductor;
an insulating layer configured to have electric insulation property and formed to cover part of the semiconductor layer;
a first electrode layer formed on the semiconductor layer, the first electrode being configured to have a work function of not less than 0.5 eV relative to electron affinity of the semiconductor layer and extended to a surface of the insulating layer to form a field plate structure;
a second electrode layer configured to have electrical conductivity and formed to cover at least a part of the first electrode layer; and
a third electrode layer formed between the first electrode layer and the second electrode layer to suppress diffusion of a metal,
wherein a distance between an edge of the part of the first electrode layer that is in contact with the semiconductor layer and the insulating layer, and the second electrode layer is equal to or greater than 0.2 μm to thereby suppress a material of the second electrode layer from contacting the edge of the part of the first electrode layer that contacts the semiconductor layer,
wherein the first electrode layer covering a side wall of the insulating layer has a film thickness that is greater than a film thickness of the first electrode layer covering the insulating layer other than the side wall,
wherein the side wall of the insulating layer has an inclined surface which is inclined with respect to surface of the semiconductor layer, and
wherein the first electrode comprises a Schottky electrode.

15. The semiconductor device according to claim 14, wherein the inclined surface has an angle of not less than 135 degrees but less than 180 degrees with respect to the surface of the semiconductor layer.

16. The semiconductor device according to claim 14, wherein the second electrode layer is mainly made of aluminum, gold, or copper.

* * * * *